United States Patent
Quilisch et al.

(10) Patent No.: US 7,068,985 B2
(45) Date of Patent: Jun. 27, 2006

(54) RADIO TRANSMITTERS WITH TEMPERATURE COMPENSATED POWER CONTROL PROFILES AND METHODS OF OPERATING SAME

(75) Inventors: Hakan Quilisch, Kista (SE); Soren Karlsson, Upplands-Vasby (SE)

(73) Assignee: Sony Ericsson Mobile Communication AB (SE)

( * ) Notice: Subject to any disclaimer, the term of this patent is extended or adjusted under 35 U.S.C. 154(b) by 455 days.

(21) Appl. No.: 10/440,819

(22) Filed: May 19, 2003

(65) Prior Publication Data

US 2004/0235438 A1 Nov. 25, 2004

(51) Int. Cl.
*H04B 1/04* (2006.01)

(52) U.S. Cl. ............... 455/127.2; 455/126; 455/115.1; 375/297; 330/279; 330/289

(58) Field of Classification Search ............. 455/115.1, 455/126, 127.1 F, 127.2, 67.11; 375/219, 375/297; 330/279, 296, 96, 289
See application file for complete search history.

(56) References Cited

U.S. PATENT DOCUMENTS

| | | | |
|---|---|---|---|
| 5,150,075 A | | 9/1992 | Hietala et al. |
| 5,603,106 A | * | 2/1997 | Toda .......................... 455/126 |
| 6,169,884 B1 | * | 1/2001 | Funk .......................... 455/522 |
| 2001/0014613 A1 | * | 8/2001 | Bergveld et al. ............ 455/522 |
| 2004/0180686 A1 | * | 9/2004 | Nakayama ................. 455/522 |
| 2004/0213335 A1 | * | 10/2004 | Forest et al. ................ 375/219 |

FOREIGN PATENT DOCUMENTS

| | | | |
|---|---|---|---|
| GB | 2281668 A | * | 8/1995 |
| JP | 10107653 A | * | 9/1996 |

OTHER PUBLICATIONS

*3rd Generation Partnership Project; Technical Specification Group GERAN; Digital cellular telecommunications system* (Phase 2+); Radio transmission and reception (Release 1996), document 3GPP TS 05.05 V5.13.0 (Aug. 2000); Annex B (normative: Transmitted power level versus time).

* cited by examiner

*Primary Examiner*—Edward F. Urban
*Assistant Examiner*—Blane J. Jackson
(74) *Attorney, Agent, or Firm*—Myers Bigel Sibley & Sajovec, PA

(57) ABSTRACT

A radio transmitter includes a power control table, a power amplifier, and a power controller. The power control table includes a plurality of control values. The power amplifier amplifies an RF signal for transmission with an adjustable gain. The power controller adjusts the gain of the power amplifier based on the power control table and a temperature signal that is indicative of a temperature of at least a portion of the radio transmitter.

14 Claims, 4 Drawing Sheets

| | Baseline Temp Power Control Table | | | | Low Temp Offset Table | | | | High Temp Offset Table | | | |
|---|---|---|---|---|---|---|---|---|---|---|---|---|
| | Control Voltage Level [V] | | | | Control Voltage Offset [V] | | | | Control Voltage Offset [V] | | | |
| Power | ILU | IHU | FP | IHD | ILD | ILU | IHU | FP | IHD | ILD | ILU | IHU | FP | IHD | ILD |
| 5 | 1.14 | 1.94 | 2.37 | 1.88 | 1.2 | -0.2 | -0.12 | -0.1 | -0.2 | -0.12 | 0.1 | 0.2 | 0.05 | 0.2 | 0.1 |
| 6 | 1.14 | 1.94 | 2.2 | 1.85 | 1.2 | -0.2 | -0.12 | -0.1 | -0.15 | -0.12 | 0.1 | 0.2 | 0.05 | 0.2 | 0.1 |
| 7 | 1.13 | 1.94 | 2.21 | 1.72 | 1.12 | -0.1 | -0.1 | -0.05 | -0.1 | -0.12 | 0.1 | 0.2 | 0.05 | 0.2 | 0.1 |
| 8 | 1.12 | 1.86 | 1.98 | 1.72 | 1.12 | -0.2 | -0.1 | -0.05 | -0.1 | -0.1 | 0.1 | 0.2 | 0 | 0.2 | 0.1 |
| 9 | 1.12 | 1.82 | 1.9 | 1.72 | 1.12 | -0.1 | -0.1 | -0.05 | -0.1 | -0.1 | 0.1 | 0.2 | 0 | 0.2 | 0.1 |
| 10 | 1.1 | 1.78 | 1.83 | 1.72 | 1.12 | -0.1 | -0.05 | 0 | -0.04 | -0.05 | 0.05 | 0.2 | 0 | 0.2 | 0.1 |
| 11 | 1.07 | 1.76 | 1.78 | 1.43 | 1.06 | 0 | -0.05 | 0 | -0.04 | -0.05 | 0.05 | 0.2 | 0 | 0.2 | 0.05 |
| 12 | 1.07 | 1.68 | 1.74 | 1.43 | 1.06 | 0 | 0 | 0 | 0 | 0 | 0.05 | 0.2 | 0 | 0.2 | 0.05 |
| 13 | 1.07 | 1.54 | 1.7 | 1.43 | 1.06 | 0 | 0 | 0 | 0 | 0 | 0.05 | 0.2 | 0 | 0.2 | 0.05 |
| 14 | 1.07 | 1.47 | 1.58 | 1.31 | 1.06 | 0 | 0 | 0 | 0 | 0 | 0.05 | 0 | 0 | 0.1 | 0.05 |
| 15 | 1.07 | 1.4 | 1.44 | 1.31 | 1.06 | 0 | 0 | 0 | 0 | 0 | 0.05 | 0 | 0 | 0.1 | 0.05 |
| 16 | 1.07 | 1.31 | 1.34 | 1.28 | 1.01 | 0 | 0 | 0 | 0 | 0 | 0 | 0 | 0 | 0.1 | 0 |
| 17 | 1.05 | 1.24 | 1.25 | 1.16 | 1.01 | 0 | 0 | 0 | 0 | 0 | 0 | 0 | 0 | 0.1 | 0 |
| 18 | 1.05 | 1.17 | 1.18 | 1.11 | 0.3 | 0 | 0 | 0 | 0 | 0 | 0 | 0 | 0 | 0 | 0 |
| 19 | 1.04 | 1.11 | 1.13 | 1.01 | 0.3 | 0 | 0 | 0 | 0 | 0 | 0 | 0 | 0 | 0 | 0 |

*Figure 4A*

| | Baseline Temp Power Control Table | | | | Low Temp Offset Table | | | | High Temp Offset Table | | | |
|---|---|---|---|---|---|---|---|---|---|---|---|---|
| | Timing for Control Voltages to Occur [µs] | | | | Timing Offset [µs] | | | | Timing Offset [µs] | | | |
| Power | ILU | IHU | FP | IHD | ILD | ILU | IHU | FP | IHD | ILD | ILU | IHU | FP | IHD | ILD |
| 5 | 11 | 24.4 | 26.1 | 573 | 576 | 1 | 0 | 0.5 | 0 | -1 | -1.5 | -0.5 | -1 | 0 | 0 |
| 6 | 10 | 24.4 | 26.1 | 573 | 576 | 1 | 0 | 0.5 | 0 | -1 | -1.5 | -0.5 | -1 | 0 | 0 |
| 7 | 10 | 24.4 | 27.1 | 573 | 576 | 0 | 0 | 0.5 | 0 | -1 | -1.5 | -0.5 | -1 | 0 | 0 |
| 8 | 10 | 24.4 | 27.1 | 573 | 576 | 0 | -1 | 0.5 | 0 | -1 | -1.5 | -0.5 | -1 | 0 | 0 |
| 9 | 10 | 24.4 | 27.1 | 573 | 576 | 0 | -2 | 0.5 | 0 | -1 | -1.5 | -0.5 | -1 | 0 | 0 |
| 10 | 10 | 25.3 | 28 | 573 | 576 | 0 | -1 | 0.5 | 0 | -1 | -1.5 | -0.5 | -1 | 0 | 0 |
| 11 | 10 | 26.2 | 28 | 574 | 577 | 0 | 0 | 0.5 | 0 | -1 | -1.5 | -0.5 | -1 | 0 | 0 |
| 12 | 10 | 26.2 | 28 | 574 | 577 | 0 | 0 | 0.5 | 0 | -1 | -1.5 | -1 | -1 | 0 | 0 |
| 13 | 10 | 27.1 | 28 | 574 | 578 | 0 | 0 | 0.5 | 0 | -1 | -1.5 | -1 | -1 | 0 | 0 |
| 14 | 10 | 27.1 | 28 | 575 | 578 | 0 | 0 | 0.5 | 0 | -1 | -2 | -1.5 | -1 | 0 | 0 |
| 15 | 10 | 27.1 | 28 | 575 | 578 | 0 | 0 | 0.5 | 0 | -1 | -2 | -1.5 | -1 | 0 | 0 |
| 16 | 10 | 27.1 | 28 | 575 | 578 | 0 | 1 | 0.5 | 0 | -1 | -2 | -1.5 | -2 | 0 | 0 |
| 17 | 10 | 27.1 | 28 | 574 | 577 | 1 | 1 | 0.5 | 0 | -1 | -2 | -1.5 | -2 | 0 | 0 |
| 18 | 10 | 27.1 | 28 | 573 | 576 | 1 | 0 | 0.5 | 0 | -1 | -2 | -1.5 | -2 | 0 | 0 |
| 19 | 10 | 27.1 | 28 | 573 | 576 | 1 | 0 | 0.5 | 0 | -1 | -2 | -1.5 | -2 | 0 | 0 |

*Figure 4B*

RADIO TRANSMITTERS WITH TEMPERATURE COMPENSATED POWER CONTROL PROFILES AND METHODS OF OPERATING SAME

FIELD OF THE INVENTION

This invention relates to the control of power amplifiers in radio transmitters, and more particular the control of the ramp-up and ramp-down of power.

BACKGROUND OF THE INVENTION

The use of power amplifiers in transmitting radio frequencies (RF) signals has many applications, including but not limited to wireless communications systems. In digital cellular communication systems, such as time division multiple access (TDMA) communications systems, wireless terminals may share a single wireless communication channel (e.g., shared frequencies) on which they broadcast. Each wireless terminal that shares a channel may be allocated a time slot on a repetitive basis. During this time slot, the wireless terminal ramps up its power amplifier to a predetermined frequency and power, sends the desired information, and at the end of the time slot, ramps down the power amplifier so as not to disturb or interfere with other wireless terminals sharing the same frequency. This ramping up and ramping down of output power defines a power profile.

Some wireless communication standards define the power profile that is to be used by wireless terminals. For example, FIG. 1 illustrates a power profile of transmission power versus time for the GSM (Global System for Mobile Communications) communication protocol. See 3rd Generation Partnership Project; Technical Specification Group GERAN; Digital cellular telecommunications system (Phase 2+); Radio transmission and reception (Release 1999), document 3GPP TS 05.05 V8 6.0 (2000-09), Annex B (normative. Transmitted power level versus time). The power profile that is illustrated in FIG. 1 includes a ramp up portion, a full power portion, and a ramp down portion.

In a TDMA digital communications systems, if a wireless terminal ramps its transmitted power up or down too slowly, information may not be properly transmitted or received within an assigned slot, and/or the transmitted information may improperly extend into an adjacent slot. In contrast, if a wireless terminal ramps up or down its transmitted power too quickly, unacceptably large spectrum widening may result that can interfere with other wireless terminals using adjacent or alternate frequencies. Therefore, a wireless terminal should change its transmission power quickly and smoothly without causing an unacceptable spectrum widening, interference, and/or loss of transmitted information.

SUMMARY OF THE INVENTION

Some embodiments of the present invention provide a radio transmitter that includes a power control table, a power amplifier, and a power controller. The power control table includes a plurality of control values. The power amplifier amplifies an RF signal for transmission with an adjustable gain. The power controller adjusts the gain of the power amplifier based on the power control table and a temperature signal that is indicative of a temperature of at least a portion of the radio transmitter.

Accordingly, the power controller may compensate for the effect of temperature on the gain of the power amplifier. The power controller may then control the power amplifier to provide a transmission power profile from the radio transmitter that may be less affected by variations in temperatures.

In some further embodiments of the present invention, the power amplifier may include a voltage-controlled power amplifier that has a gain that is adjustable based on a control voltage profile, and the power controller may generate the control voltage profile based on the temperature signal. The power controller may adjust a timing profile for the control voltage profile based on the temperature signal. The power control table may include a plurality of control values that define a profile for ramping up and ramping down the gain of the power amplifier according to a time division multiple access communication protocol.

The power control table may include a first power control table and a second power control table, and the power controller may select between the first and second power control tables to adjust the gain of the power amplifier based upon the temperature signal. As will be appreciated, some embodiments of the present invention may include more than two power control tables with the power controller adjusting the gain of the power amplifier using the power control tables. A power control table may include a baseline power control table that defines a plurality of voltage values and corresponding timing values, and a high temperature offset control table that defines a plurality of voltage values and corresponding timing values. The power controller may adjust the gain of the power amplifier based on the baseline power control table when the temperature signal satisfies a predetermined baseline temperature value, and may combine (e.g., by adding) the values of the baseline power control table and the values of the high temperature offset control table to adjust the gain of the power amplifier when the temperature signal satisfies a predetermined high temperature value. The power control table may further include a low temperature offset control table that defines a plurality of voltage values and corresponding timing values, and the power controller may combine (e.g., by removing) the values of the baseline power control table and the values of the low temperature offset control table to adjust the gain of the power amplifier when the temperature signal satisfies a predetermined low temperature value.

The power control table may include one or more shift registers. The radio transmitter may further include, a thermistor that generates the temperature signal based on a temperature of at least a portion of the radio transmitter.

Other embodiments of the present invention provide a method of controlling a power amplifier in a radio transmitter. The method includes providing a power control table that includes a plurality of control values, amplifying an RF signal for transmission with an adjustable amplification gain, and adjusting the amplification gain based on the plurality of control values in the power control table and based on a temperature signal that is indicative of a temperature of at least the power amplifier.

The amplification gain may be adjusted by generating a voltage signal and/or adjusting a timing of the voltage signal based on the power control table and the temperature signal. The power control table may include a plurality of control values that define a profile of ramp up and ramping down the amplification gain according to a time division multiple access communication protocol. The power control table may further include a first power control table and a second power control table, and the amplification gain may be adjusted by selecting between the first power control table and the second power control table based on the temperature signal.

Other embodiments of the present invention provide a radio transmitter that includes a power amplifier and a power controller. The power amplifier amplifies an RF signal for transmission with an adjustable gain. The power controller adjusts the gain of the power amplifier based on temperature dependent control values and a temperature signal that is indicative of a temperature of at least a portion of the radio transmitter. The temperature dependent control values may be generated by an algorithm that relates predetermined control values and the temperature signal to the temperature dependent control values.

Other embodiments of the present invention may provide a similar method of compensating for a varying supply voltage, where the supply voltage is known and may be compensated with similar operations.

BRIEF DESCRIPTION OF THE DRAWINGS

FIGS. 4A and 4B illustrate power control tables according to embodiments of the present invention.

DETAILED DESCRIPTION

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout.

It also will be understood that, as used herein, the term "comprising" or "comprises" is open-ended, and includes one or more stated elements, steps and/or functions without precluding one or more unstated elements, steps and/or functions.

The present invention is described below with reference to block diagrams and/or flowchart illustrations of methods and wireless terminals according to embodiments of the invention. It is understood that each block of the block diagrams and/or operational illustrations, and combinations of blocks in the block diagrams and/or operational illustrations, can be implemented by radio frequency, analog and/or digital hardware, and/or computer program instructions. These computer program instructions may be provided to a processor of a general purpose computer, special purpose computer, ASIC, and/or other programmable data processing apparatus in a wireless terminal, such that the instructions, which execute via the processor of the computer and/or other programmable data processing apparatus, create means for implementing the functions/acts specified in the block diagrams and/or operational block or blocks. In some alternate implementations, the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved.

Figure 1:
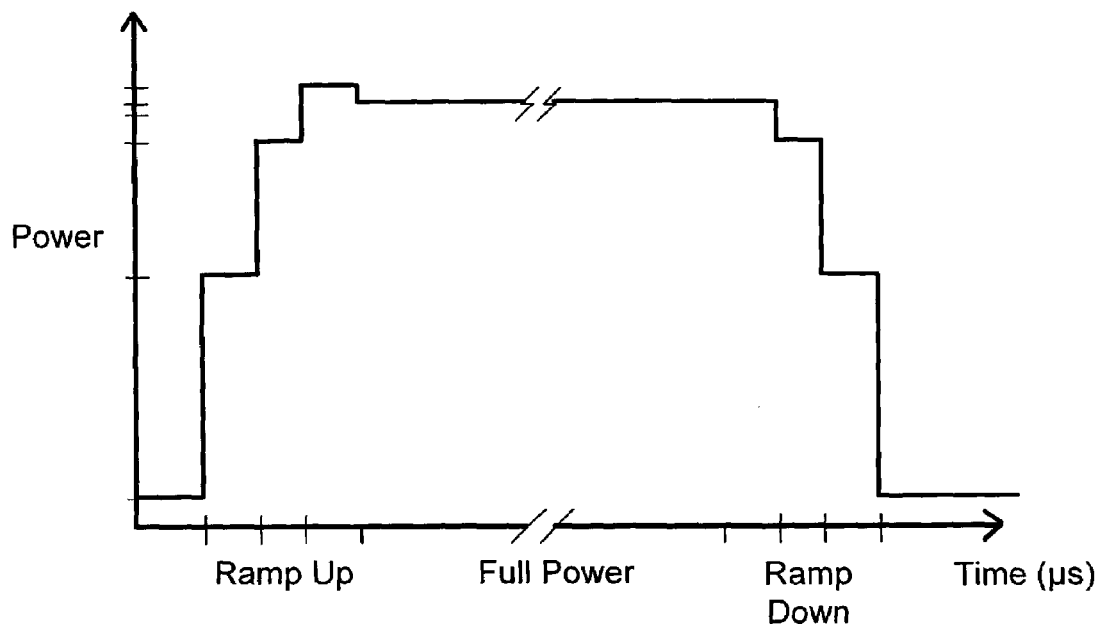
FIG. 1 illustrates an example transmission power profile for a GSM wireless terminal according to the prior art.
Figure 2:
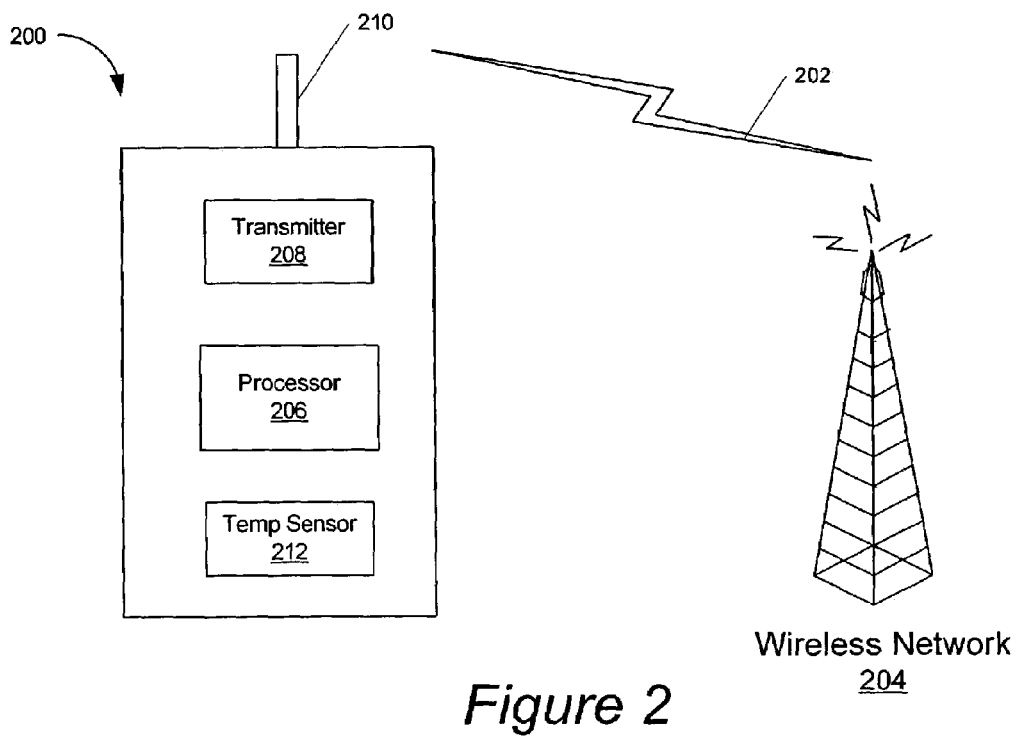
FIG. 2 illustrates a wireless terminal communicating with a wireless network according to embodiments of the present invention.

FIG. 2 illustrates a wireless terminal 200 that is configured to communicate through at least one wireless communication channel 202 with a wireless network 204. The wireless terminal 200 includes a processor 206, a transmitter 208, an antenna 210, and a temperature sensor 212. The processor 206 formats information for transmission according to a wireless communication protocol. The formatted information may be modulated with a carrier signal and amplified by the transmitter 208 for transmission by the antenna 210 through the wireless communication channel 202.

As used herein, a "wireless terminal" includes, but is not limited to, a cellular wireless terminal; a personal communication terminal that may combine a cellular wireless terminal with data processing, facsimile and data communications capabilities; a personal data assistance (PDA) that can include a wireless transceiver, pager, Internet/intranet access, local area network interface, wide area network interface, Web browser, organizer, and/or calendar; and a mobile or fixed computer or other device that includes a wireless transceiver. The wireless terminal 200 may be configured to communicate according to one or more wireless communication protocols, including, but not limited to, ANSI-136, GSM, code division multiple access (CDMA), wideband-CDMA, CDMA2000, Enhanced Data Rates for GSM Evolution (EDGE), Universal Mobile Telecommunications System (UMTS), a wireless local area network (WLAN) protocol, including IEEE 802.11b, and Bluetooth, satellite protocols, private land mobile radio protocols, including PROJECT-25 and Tetra, and/or other communication protocols. Communication protocols as used herein may specify the information communicated, the timing, the frequency, the modulation, and/or the operations for setting-up and/or maintaining a communication connection.

The transmitter 208 ramps up and down its output power according to a plurality of predetermined transmission power profiles. Transmitters generally include analog circuitry whose parameters can change with temperature. For example, a transmitter may include operational amplifiers with a high gain (e.g., 100,000) that can substantially vary with the temperature of the operational amplifiers. Consequently, when the transmitter is designed to provide a predetermined transmission power profile at a baseline temperature, variations in temperature from the baseline temperature may result in unacceptable variations in its transmission power profile, for which embodiments of the present invention can compensate.

According to embodiments of the present invention, the transmitter 208 uses a temperature signal generated by temperature sensor 212 to compensate for effects of temperature on the components of the transmitter 208 and it transmission power profile. The temperature sensor 212 may be a thermistor or other temperature sensitive circuit that is configured to indicate a temperature of a least a portion of the transmitter 208. For example, the temperature sensor 212 may sense a temperature within a housing of the wireless terminal 200, which in-turn is indicative of a temperature of a least a portion of the transmitter 208, and/or it may sense a temperature of one or more components within the transmitter 208. Accordingly, although the temperature sensor 212 is illustrated separate from the transmitter 208 and processor 206, it may be part of the transmitter 208 and/or the processor 206 or another component of the wireless terminal 200. The temperature signal generated by the temperature sensor 212 may be communicated directly to the transmitter 208 or indirectly such as, for example, through the processor 206.

Figure 3:
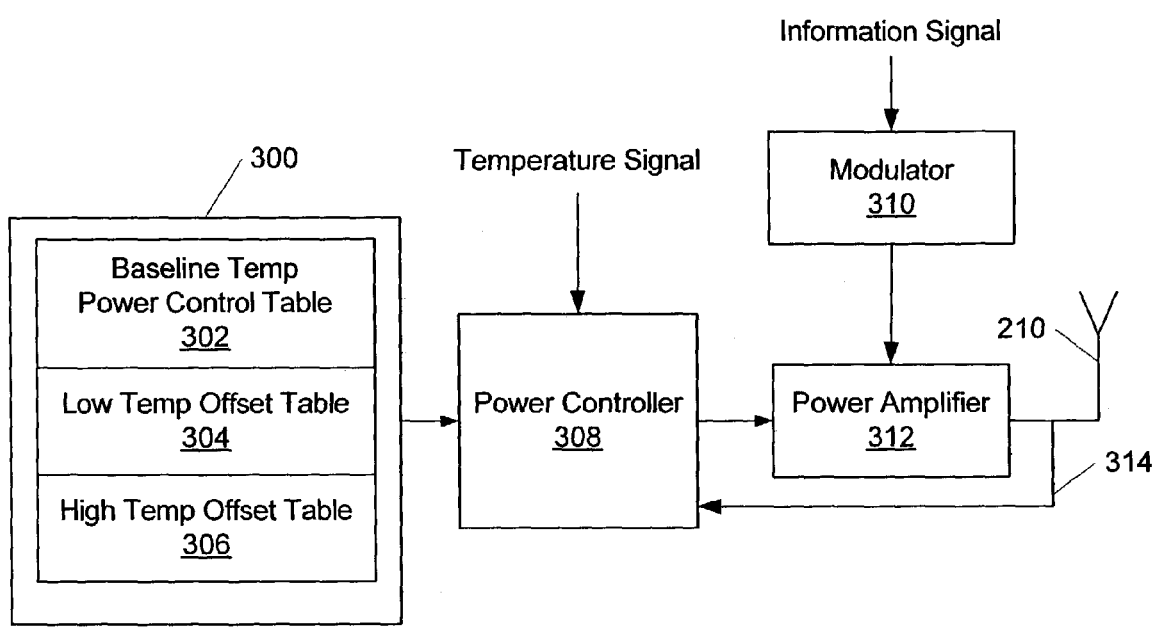
FIG. 3 illustrates a radio transmitter according to embodiments of the present invention.

FIG. 3 illustrates embodiments of the transmitter 208 that compensate for temperature effects on its transmission power profile. As illustrated in FIG. 3, the transmitter 208-includes a power control table 300, a power controller 308, and a power amplifier 312, and may further include a modulator 310. The power amplifier 312 amplifies a RF signal by an adjustable gain for transmission by the antenna 210. The RF signal may be an information signal that has been modulated and upconverted to a carrier frequency by the modulator 310. The power control table 300 may include a plurality of control values that define a profile of ramping up and ramping down the gain of the power amplifier 312. The power controller 308 adjusts the gain of the power amplifier 312 based on the control values of the power control, table 300 and a temperature signal ;from-the temperature sensor 212. The power controller 308 may provide closed-loop control of the output power of the power amplifier 312 with a feedback loop 314 that feeds back an indication of the output power of the RF signal provided to the antenna 210.

The power amplifier 312 may include a voltage-controlled power amplifier that has a gain that is adjustable based on a control voltage. The power control table 300 may include a baseline temperature power control table 302, a low temperature offset table 304, and a high temperature offset table 306. The baseline temperature power control table 302, the low temperature offset table 304, and the high temperature offset table 306 may each include a plurality of control voltage values and/or associated timing values. It will be understood that the control voltage values and/or associated timing values may be values that can be directly or indirectly respectively translated or converted into control voltages and/or timing events.

The power controller 308 may include a digital-to-analog converter that converts control voltage values and associated timing values from the power control table 300 into a control voltage profile. The control voltage profile may be used to control the gain of power amplifier 312 over time to generate a transmission power profile. The control voltage profile may be smoothed and/or filtered to reduce or remove abrupt changes that may be caused, for example, by the step differences between the control voltage values and between the timing values in the power control table 300. The power control table 300 may further include one or more shift registers having the control voltage values, and which may be sequentially clocked, for example based on the timing values, to provide a sequence of the control voltage values to a digital-to-analog converter to form a control voltage profile.

When the temperature signal satisfies a predetermined baseline temperature value, the power controller 308 uses the values of the baseline temperature power control table 302 to adjust the gain of the power amplifier 312. In contrast, when the temperature signal satisfies a predetermined high temperature value, the power controller 308 combines, for example by adding, the values of the baseline temperature power control table 302 with the values of the high temperature offset table 306 to adjust the gain of the power amplifier 312. Similarly, when the temperature signal satisfies a predetermined low temperature value, the power controller 308 combines, for example by removing, the values of the low temperature offset table 304 from the values of the baseline temperature power control table 302 to adjust the gain of the power amplifier 312.

Accordingly, the power control table 300 may change the profile of the control values that are provided to the power amplifier 312 based on the temperature signal. In this manner, the effects of temperature on the transmitter 208 and, in particular, its effect on the gain of the power amplifier 312, may be compensated using the values of the power control table 300 and the temperature signal. Consequently, the effects of temperature on the transmission power profile of the transmitter 208 may be reduced.

FIGS. 4A and 4B illustrate an example of a power control table according to embodiments of the present invention that may be appropriate when the wireless terminal 200 is compliant with the GSM wireless communication standard. Referring first to FIG. 4A, a baseline temperature power control table is illustrated that includes a table of control voltage levels, in volts, that control the ramp up of transmission power from 0 through an intermediate-low ramp up (ILU) value and an intermediate-high ramp up (IHU) value to a full power (FP) value. The baseline temperature power control table also includes control voltage levels that control the ramp down of transmission power from full power through an intermediate-high ramp down (IHD) value and an intermediate-low ramp down (ILD) value to zero power. The full power that is transmitted by the wireless terminal 200 can vary based on, for example, power commands from the wireless network 204. In this example, 15 different full power levels are provided in the tables (shown as "Power" levels 5 through 19), and corresponding control voltage levels are provided for each of the 15 different full power levels.

FIG. 4A also illustrates a low temperature offset table and a high temperature offset table. The low temperature offset table defines control voltage offset values that may be combined with the control voltage levels of the baseline temperature power control table to provide control voltages that are compensated in a predetermined manner for low temperature effects on the transmitter. Similarly, the high temperature offset table defines control voltage offset values that may be combined with the control voltage levels of the baseline temperature power control table to provide control voltages that are compensated in a predetermined manner for high temperature effects on the transmitter.

FIG. 4B illustrates a baseline temperature power control table that defines timing values, in microseconds, for the sequential timing of the control voltage levels, illustrated in FIG. 4A, relative to a reference start time, which may, for example, correspond to a beginning of an assigned slot in a TDMA protocol. A low temperature offset table of timing offsets and a high temperature offset table of timing offsets are also provided.

An example of the use of the control tables of FIGS. 4A and 4B with the transmitter 208 of FIG. 3 is provided below. When the temperature signal indicates that the temperature of the transmitter 208 is within a baseline temperature range, and a full power transmission level of 5 is desired, the power controller 308 increases a control voltage that is provided to the power amplifier 312 to 1.14 volts (ILU voltage) at 11 microseconds (ILU timing) after a reference start time. The control voltage is increased to 1.94 volts (IHU voltage) at 24.4 microseconds (IHU timing) after the reference start time. The control voltage is then increased to 2.37 volts (FP voltage) at 26.1 microseconds (FP timing) after the reference start time. At 566 microseconds (IHD timing) after the reference start time, which may correspond to an end of an assigned slot, the control voltage is first decreased to 1.88 volts (IHD volts), and then further decreased to 1.2 volts (ILD volts) at 569 microseconds (ILD timing) after the reference start time, and then continues to smoothly decrease to zero.

In a similar example in which the temperature signal indicates that the transmitter 208 is below a baseline temperature range, the control voltages and associated timing are defined by combining the low temperature offset tables with the baseline temperature power control tables. Accordingly, the control voltage is increased to 0.94 volts (i.e., 1.14−0.2) at 12 microseconds (i.e., 11+1) after the reference start time, then it is increased to 1.82 volts (i.e., 1.94−0.12) at 24.4 microseconds (i.e., 24.4+0), and is then increased to 2.27 volts (i.e., 2.37−0.1) at 26.6 microseconds (i.e., 26.1+0.5). The low temperature offset tables are similarly combined with the baseline temperature power control-tables to define the control voltages that are used to ramp down the transmission power level.

When the temperature signal indicates that the transmitter 208 is above a baseline temperature range, the control voltages and associated timing are generated by combining the high temperature offset tables with the baseline temperature power control tables.

Although power control tables illustrated in FIGS. 4A and 4B include control voltage values and timing values, embodiments of the present invention are not limited to using both control voltage values and timing values to control the gain of a power amplifier. For example, the low temperature offset table and/or the high temperature offset table may include only one of the control voltage offset values and the timing offset values. Accordingly, a power controller may compensate the control voltages values or the timing offset values based on a temperature signal. Moreover, temperature compensation may be provided using only one of the two off tables (high temperature offset/low temperature offset), or with more than two offset tables). In yet other embodiments, a power controller may adjust the gain of the power amplifier based on temperature dependent control values and a temperature signal that is indicative of a temperature of at least a portion of the radio transmitter. The temperature dependent control values may be generated by an algorithm that relates predetermined control values, which may be the control values provided in the baseline temperature power control table, and the temperature signal to the temperature dependent control values.

Figure 5:
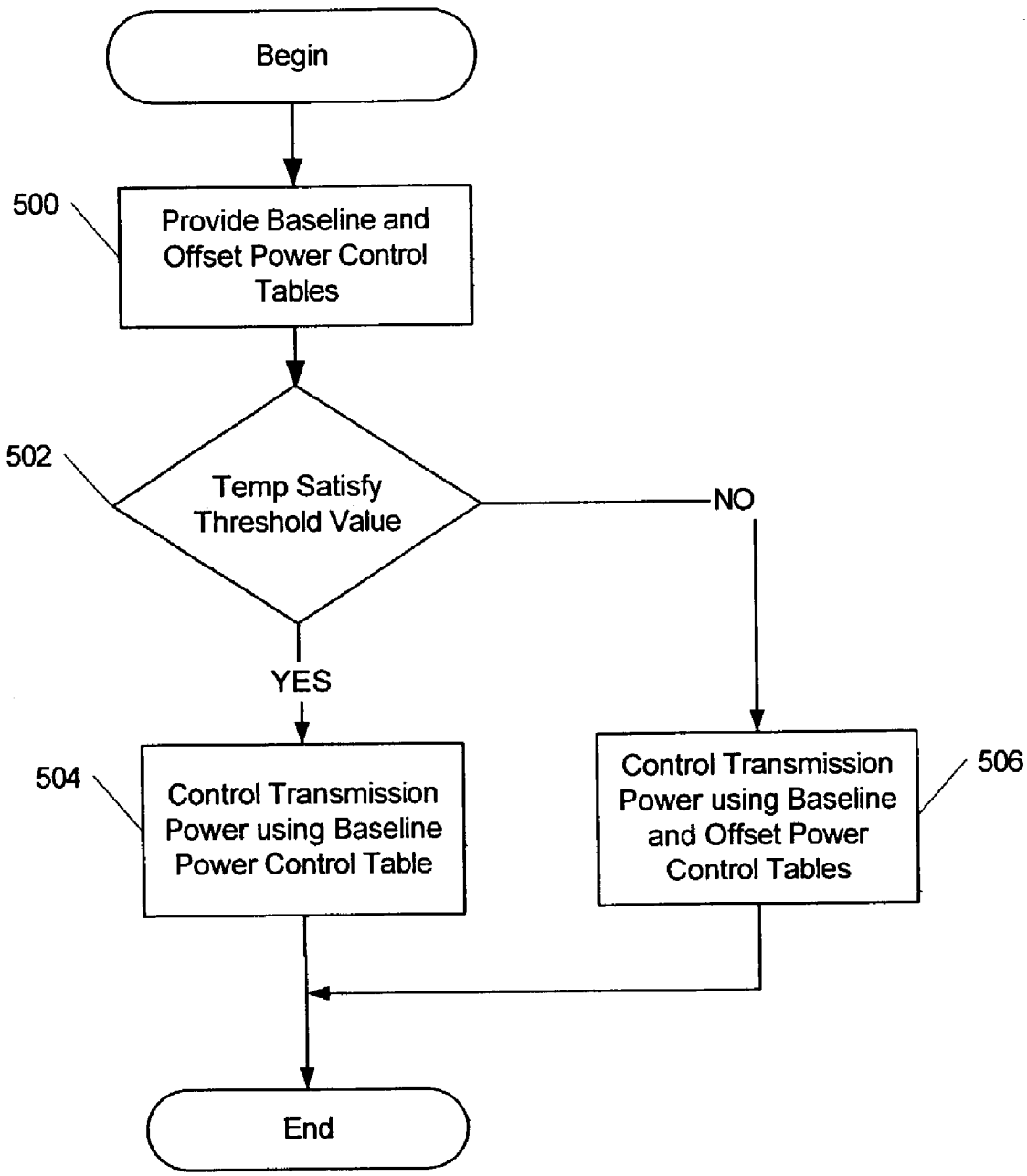
FIG. 5 is a flowchart that illustrates operations for controlling a power amplifier according to embodiments of the present invention.

FIG. 5 illustrates operations that may be used to control an adjustable gain of a power amplifier according to embodiments of the present invention. At block 500, a baseline power control table and an offset profile table are provided. At block 502, a temperature signal that indicates the temperature of at least a portion of the power amplifier is compared to one or more threshold values. At block 504, when the temperature satisfies a threshold value, for example when the temperature is within a baseline temperature range, the baseline power control table is used to adjust the gain of the power amplifier.

In contrast, at block 506, when the temperature does not satisfy the threshold value, for example when the temperature is outside of the baseline temperature range, the baseline power control table and the offset profile table are used to adjust the gain of the power amplifier. In other embodiments of the present invention, the gain of the power amplifier may be adjusted at block 506 using the offset profile table and not the baseline power control table by, for example, providing temperature compensated control values in the offset profile table.

Although the example tables of FIGS. 4A–B provide three power step values for power ramp-up: and ramp-down, embodiments of the present invention may include any number of step values. For example, a smoother power ramp-up and/or ramp-down may be provided by using power tables that include more than three power step values, and/or by interpolating or extrapolating step values among values that are provided by the power tables.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A radio transmitter comprising:
 a power control table that includes a plurality of control values;
 a power amplifier that is configured to amplify with an adjustable gain an RF signal for transmission; and
 a power controller that is configured to adjust the gain of the power amplifier based on the control values of the power control table and a temperature signal that is indicative of a temperature of at least a portion of the radio transmitter, wherein:
 the power control table comprises a baseline power control table that defines a plurality of voltage values and corresponding timing values; and comprises a high temperature offset control table that defines a plurality of voltage values and corresponding timing values; and
 the power controller is further configured to adjust the gain of the power amplifier based on the baseline power control table when the temperature signal satisfies a predetermined baseline temperature value, and is configured to combine the values of the baseline power control table and the values of the high temperature offset control table to adjust the gain of the power amplifier when the temperature signal satisfies a predetermined high temperature value.

2. The radio transmitter of claim 1, wherein:
 the power amplifier comprises a voltage-controlled power amplifier that has a gain that is adjustable based on a control voltage profile; and
 the power controller is further configured to generate the control voltage profile based on the temperature signal.

3. The radio transmitter of claim 2 wherein the power controller is further configured to adjust a timing profile for the control voltage profile based on the temperature signal.

4. The radio transmitter of claim 1, wherein the power control table includes a plurality of control values that define a profile of ramping up and ramping down the gain of the power amplifier according to a time division multiple access communication protocol.

5. The radio transmitter of claim 1, wherein:
 the power control table further comprises a low temperature offset control table that defines a plurality of voltage values and corresponding timing values; and
 the power controller is further configured to combine the values of the baseline power control table and the values of the low temperature offset control table to adjust the gain of the power amplifier when the temperature signal satisfies a predetermined low temperature value.

6. The radio transmitter of claim 1, wherein:
 the power controller is further configured to add the values of the high temperature offset control table to the values of the baseline power control table to adjust the gain of the power amplifier when the temperature signal satisfies the predetermined high temperature value, and is configured to remove the values of the low temperature offset power control table from the values of the baseline power control table to adjust the gain of the power amplifier when the temperature signal satisfies the predetermined low temperature value.

7. The radio transmitter of claim 1, wherein the power control table comprises one or more shift registers.

8. The radio transmitter of claim 1, further comprising a thermistor that generates the temperature signal based on a temperature of at least a portion of the radio transmitter.

9. A method of controlling a power amplifier in a radio transmitter, the method comprising:
   providing a power control table that includes a plurality of control values;
   amplifying an RF signal for transmission with an adjustable amplification gain;
   adjusting the amplification gain based on the plurality of control values in the power control table and based on a temperature signal that is indicative of a temperature of at least the power amplifier, wherein:
   providing a power control table comprises providing a baseline power control table that defines a plurality of voltage values and corresponding timing values, and providing a high temperature offset control table that defines a plurality of voltage values and corresponding timing values; and
   adjusting the amplification gain comprises adjusting the amplification gain based on the baseline power control table when the temperature signal satisfies a predetermined baseline temperature value, and comprises adjusting the amplification gain based on a combination of the values of the baseline power control table and the values of the high temperature offset control table when the temperature signal satisfies a predetermined high temperature value.

10. The method of claim 9, wherein adjusting the amplification gain comprises generating a voltage signal based on the power control table and the temperature signal.

11. The method of claim 10 wherein adjusting the amplification gain comprises adjusting a timing of the voltage signal based on the power control table and the sensed temperature.

12. The method of claim 9, wherein providing a power control table comprises providing a plurality of control values that define a profile of ramp up and ramping down the amplification gain according to a time division multiple access communication protocol.

13. The method of claim 9, wherein:
   providing a power control table further comprises providing a low temperature offset control table that defines a plurality of voltage values and corresponding timing values; and
   adjusting the amplification gain comprises adjusting the amplification gain based on a combination of the values of the baseline power control table and the values of the low temperature offset control table when the temperature signal satisfies a predetermined low temperature value.

14. The method of claim 9, wherein adjusting the amplification gain comprises:
   adding the values of the high temperature offset control table to the values of the baseline power control table to adjust the amplification gain when the temperature signal temperature signal satisfies the predetermined high temperature value; and
   removing the values of the low temperature offset control table from the values of the baseline power control table to adjust the amplification gain when the temperature signal satisfies the predetermined low temperature value.

* * * * *